United States Patent

Konuma et al.

[11] Patent Number: 5,885,888
[45] Date of Patent: Mar. 23, 1999

[54] ETCHING MATERIAL AND ETCHING PROCESS

[75] Inventors: Toshimitsu Konuma; Akira Sugawara; Yukiko Uehara, all of Kanagawa, Japan

[73] Assignee: Semiconductor Energy Laboratory Co., Ltd., Kanagawa, Japan

[21] Appl. No.: 800,184

[22] Filed: Feb. 13, 1997

Related U.S. Application Data

[62] Division of Ser. No. 436,907, May 8, 1995, Pat. No. 5,639,344.

[30] Foreign Application Priority Data

May 11, 1994 [JP] Japan ................................ 6-121954

[51] Int. Cl.[6] .............................................. H01L 21/302
[52] U.S. Cl. ........................ 438/585; 438/197; 438/694; 438/751; 438/754
[58] Field of Search ................................. 438/197, 585, 438/694, 749, 751, 754

[56] References Cited

U.S. PATENT DOCUMENTS

| | | | |
|---|---|---|---|
| 3,825,454 | 7/1974 | Kikuchi et al. | 216/41 |
| 4,003,772 | 1/1977 | Hanazono et al. | 156/3 |
| 4,045,302 | 8/1977 | Gibbs et al. | 204/15 |
| 4,336,111 | 6/1982 | Graunke | 156/627 |
| 4,900,695 | 2/1990 | Takahashi et al. | 437/195 |
| 5,430,320 | 7/1995 | Lee | 257/412 |
| 5,639,344 | 6/1997 | Konuma et al. | 156/652.1 |

FOREIGN PATENT DOCUMENTS

| | | |
|---|---|---|
| 2307814 | 8/1973 | Germany . |
| 148226 | 12/1980 | India . |
| 51-034677 | 3/1976 | Japan . |
| 54-032280 | 3/1979 | Japan . |
| 55-013931 | 1/1980 | Japan . |
| 62-03379 | 9/1987 | Japan . |
| 1019019 | 5/1983 | U.S.S.R. . |

OTHER PUBLICATIONS

"Controlling The Interfacial Oxide Layer of Ti–Al Contacts with the $CrO_3$–$H_3PO_4$ Etch"; Shankoff et al.; J. Elect. Soc. (1978), 125(3); pp. 467–471.

Primary Examiner—Benjamin Utech
Assistant Examiner—George Goudreau
Attorney, Agent, or Firm—Sixbey, Friedman, Leedom & Ferguson, P.C.; Gerald J. Ferguson, Jr.; Jeffrey L. Costellia

[57] ABSTRACT

An etching material comprising at least phosphoric acid, acetic acid, and nitric acid, with chromic acid added therein. Also claimed is an etching process using the etching material above, provided that the process comprises selectively etching, by using the solution, an aluminum oxide layer formed on the surface of a material containing aluminum as the principal component thereof.

8 Claims, 3 Drawing Sheets

ETCHING MATERIAL AND ETCHING PROCESS

This is a Divisional application of Ser. No. 08/436,907, filed May 8, 1995, now U.S. Pat. No. 5,639,344.

BACKGROUND OF THE INVENTION

The present invention relates to an etching material, particularly, an etchant for use in etching selectively a layer of an aluminum oxide formed on aluminum, and to an etching process using the same.

Known processes for fabricating semiconductor circuits (ICs) include a technology which comprises using aluminum for the interconnection. An example of the technology is described below with reference to FIGS. 1(A) to 1(D) which illustrate a diagram showing a process for fabricating an electrode or an interconnection 101 based on aluminum on an appropriate base made of an insulator, an insulating film, a semiconductor, etc. Referring first to FIG. 1(A), an electrode or an interconnection 101 containing aluminum as the principal component is formed on a base 100 by means of evaporation and the like. Then, an oxidized aluminum layer (oxide layer) 102 is formed by effecting anodic oxidation in an electrolytic solution using the electrode or the interconnection 101 containing aluminum as the principal component as an anode. The oxide layer 102 is utilized to improve the withstand voltage or to form an offset region of a thin film transistor.

After forming the oxide layer 102, a silicon oxide layer or a silicon nitride layer is formed as an interlayer dielectric 103. A proper mask (generally, a resist) 107 is used to form a contact interconnection with the electrode or the interconnection 101, and etching is performed to form a perforated hole 104 as shown in FIG. 1(C).

The step above is effected by using a buffered hydrofluoric acid or pure hydrofluoric acid as an etchant. Upon completion of the perforation, a proper metallic interconnection is formed by means of vapor deposition or sputtering to form a contact for the electrode or the interconnection 101.

In a practical fabrication process, however, etching proceeds as such to yield an etched state 106 as illustrated in FIG. 1(D). This leads to a problem of forming a deeply etched portion on a part of the electrode or the interconnection 101.

The problem above is attributed to the fact that, when etching is performed using a hydrofluoric acid-based etchant, the etching rate of the aluminum oxide layer 102 becomes far lower than that of the electrode or the interconnection 101 containing aluminum as the principal component.

The problem above can be overcome by a technique which enables selective removal of the aluminum oxide layer. For example, a technique capable of selectively removing the aluminum oxide layer by using an etchant is required. A mixed solution of phosphoric acid and water, with about several percents of chromic anhydride and caustic soda added therein is known as an etchant for use in the etching of an oxide layer formed by anodic oxide using aluminum as the anode.

However, the solution above contains water at a large quantity. Accordingly, the composition of the etchant tends to fluctuate during the etching step, because water vaporizes due to heating (in general, the solution is heated to about 65° C.). Therefore, because of the problems concerning reproducibility and stability, the technique above is practically unfeasible in a semiconductor fabrication process where a precise control in the level of several hundreds of angstroms (Å) is required.

Furthermore, there are cases in which a porous oxide layer alone is removed after forming a dense oxide layer and a porous oxide layer around the electrode or the interconnection containing aluminum as the principal component. In such cases, an etchant which enables etching of the porous oxide layer at a higher etching rate is necessary.

Concerning the well-known etchant comprising a mixed solution of phosphoric acid and water with chromic anhydride added therein at a quantity of several percents, the etching rate for a porous oxide layer (aluminum oxide layer) does not considerably differ from that for a dense oxide layer. This requires an etching process under severely controlled conditions, and hence, leads to problems considering the stability and the yield of the operation. Conclusively, it was found practically difficult to selectively remove the porous oxide layer alone.

SUMMARY OF THE INVENTION

In the light of the aforementioned circumstances, an object of the present invention is to provide an etchant capable of selectively etching the oxide layer of aluminum. Another object of the present invention is to provide an etchant which enables the etching above in excellent reproducibility and with good controllability. A further other object of the present invention is to provide an etchant which enables etching of a porous aluminum oxide layer at a highest rate possible as compared with that for a dense aluminum oxide layer.

Thus, according to an aspect of the present invention, there is provided an etching material comprising a solution containing at least phosphoric acid, acetic acid, and nitric acid, with chromic acid added therein.

Preferably in the constitution above, the etching material contains at a ratio by volume, from 40 to 90 parts of phosphoric acid, from 10 to 100 parts of acetic acid, and from 1 to 40 parts of nitric acid.

Also preferred in the constitution above is to add from 1 to 10% by weight of chromic acid to the solution.

By using the solution of the constitution above as an etchant, an aluminum oxide layer formed on the surface of a material containing aluminum as the principal component can be etched selectively. Chromic acid as referred herein is an oxidizing agent expressed by $CrO_3$.

Preferably, the etching process is effected at a temperature of 50° C. or higher. An etching rate not lower than a certain value can be maintained by heating the solution to a certain temperature or higher. In general, the etching is effected at a temperature in a range of from 50° to 200° C.

According to a still other aspect of the present invention, there is provided an etching process using a solution comprising at least phosphoric acid, acetic acid, and nitric acid, with chromic acid added therein, provided that the process comprises selectively etching a porous aluminum oxide by using the solution.

The constitution above is based on the fact that a porous aluminum oxide can be etched 10 times or more faster than a dense aluminum oxide to result in a large selectivity ratio by effecting etching using a solution comprising phosphoric acid, acetic acid, and nitric acid, with chromic acid added therein.

According to a yet other aspect of the present invention, there is provided an etching process using a solution comprising at least phosphoric acid, acetic acid, and nitric acid, with chromic acid added therein, provided that the process comprises etching a porous aluminum oxide by using the solution.

According to a further other aspect of the present invention, there is provided an etching material comprising at least phosphoric acid, acetic acid, and nitric acid, with chromic acid added therein, provided that the etching material etches a porous aluminum oxide at a rate ten times or more higher than a dense aluminum oxide.

In the constitutions described above, any material known as an oxidizing agent can be used in the place of chromic acid. For instance, a material expressed by $Fe_2O_3$ can be used.

By using a solution comprising phosphoric acid, acetic acid, and nitric acid as the principal components, with chromic acid added therein, etching can be effected at a temperature as high as 60° C., and yet, with high reproducibility and stability free of change in the composition of the solution.

Because chromic acid forms a barrier layer on the surface of aluminum, the oxide layer alone can be etched in case of etching an oxide layer (a layer of aluminum oxide) formed on the surface of aluminum or a material containing aluminum as the principal component. Thus, etching can be stopped at the surface portion of aluminum or the material containing aluminum as the principal component. Conclusively, the aluminum oxide layer alone can be removed selectively.

The etchant comprising phosphoric acid, acetic acid, and nitric acid as the principal components, with chromic acid added therein, exerts etching at a high rate on the porous oxide containing aluminum as the principal component. Thus, the enchant can be used for selectively etching the porous oxide alone.

By using both acetic acid and nitric acid at the same time, a smooth etched surface can be obtained.

DETAILED DESCRIPTION OF THE INVENTION

The present invention is described in further detail below referring to non-limiting examples.

EXAMPLE

The present example refers to a process for fabricating a thin film transistor (TFT) on a glass substrate according to an embodiment of the present invention.

Figure 1A:
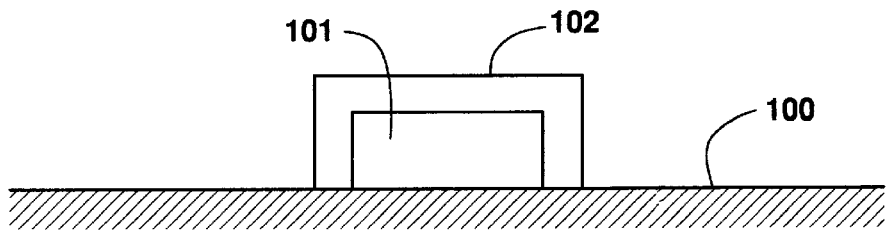
FIGS. 1(A) to 1(D) are a diagram showing schematically a state of a conventional interconnection obtained using aluminum.
Figure 1B:
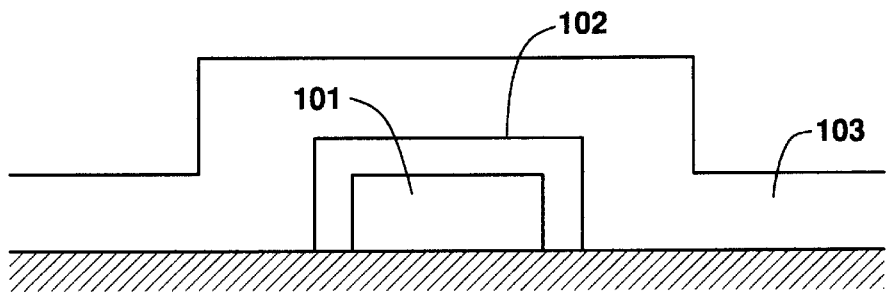
Figure 1C:
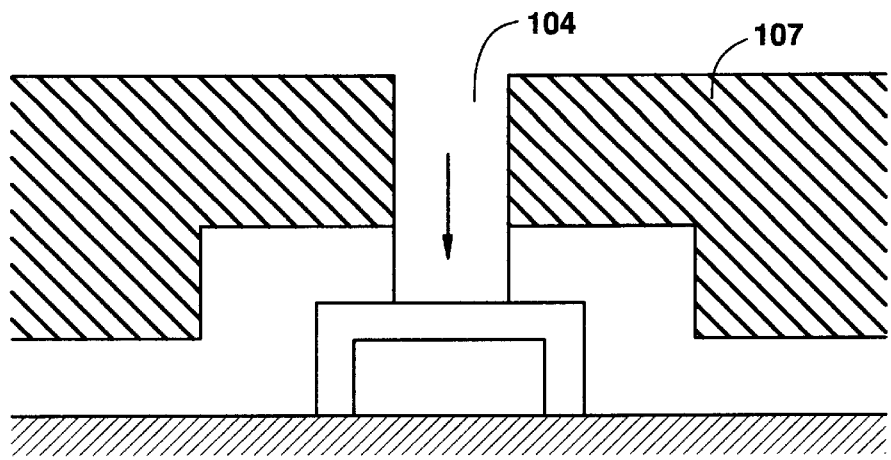
Figure 1D:
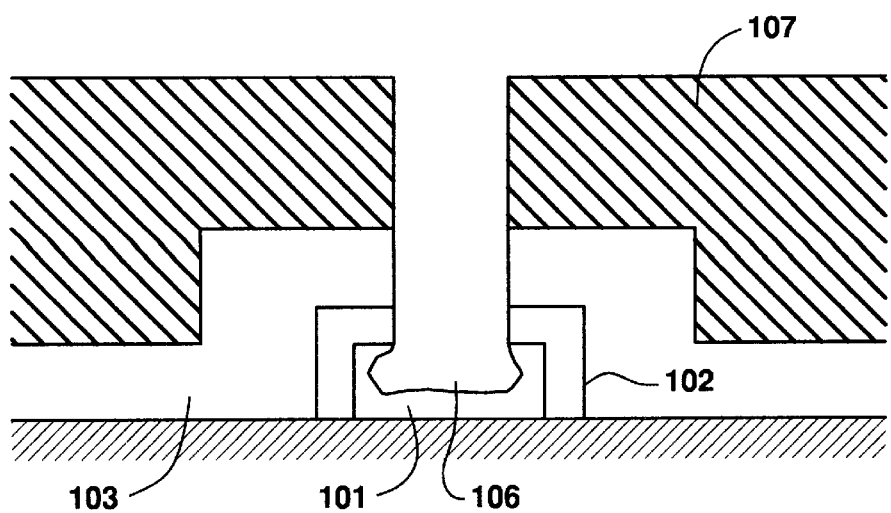
Figure 2A:
FIGS. 2(A) to 2(F) are a diagram showing schematically the process steps for fabricating a thin film transistor (TFT) according to an embodiment of the present invention.

Referring to FIG. 2(A), a silicon oxide film or a silicon nitride film (not shown in the figure) is deposited by means of plasma-assisted CVD or sputtering on a glass substrate 201 as a base coating to a thickness of from about 1,000 to 2,000 Å.

A 1,000 Å thick amorphous silicon film is deposited thereafter by plasma-assisted CVD or by reduced pressure thermal CVD. The amorphous silicon film is crystallized thereafter by heating or by irradiating thereto a laser light or an intense light. A crystalline thin film of silicon is obtained in this manner. As a matter of course, the silicon film can be used as it is in the amorphous state without subjecting it to a crystallization process.

The crystalline silicon film is then patterned into an active layer for a TFT to obtain an active layer 202 as illustrated in FIG. 2(A). A silicon oxide film is deposited thereafter to a thickness of 1,000 Å by means of plasma-assisted CVD or sputtering to obtain a gate insulating film 203(FIG. 2(A)).

Figure 2B:
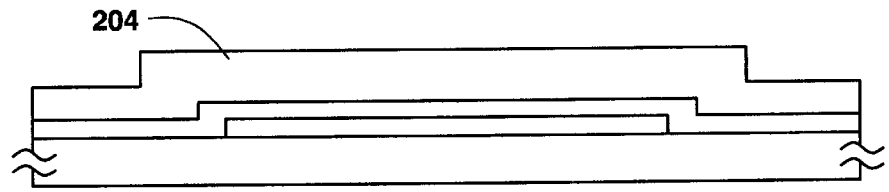

A film containing aluminum as the principal component is deposited to a thickness of 5,000 Å by means of evaporation and the like to provide a gate electrode (FIG. 2(B)).

A dense oxide layer 205 is formed thereafter by effecting anodic oxidation in an electrolytic solution by using the aluminum film 204 as an anode. The oxide layer 205 is formed to a thickness of about 150 Å. This step is effected by applying a voltage of 10 V and using an electrolytic solution obtained by neutralizing an ethylene glycol solution containing 3% of tartaric acid with ammonia water.

Figure 2C:
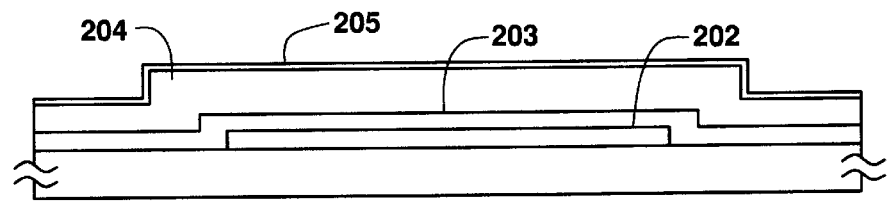

The dense oxide layer obtained in the step above plays an important role in the later step for forming a porous oxide layer (FIG. 2(C)).

Etching is effected thereafter by using a resist 206 as a mask to form a gate electrode 207. The step of etching the oxide layer 205 is performed separately from the step of etching the aluminum film 204. More specifically, a step for etching the oxide layer 205 and another step for etching the aluminum film 204 are performed. As an etchant for etching the aluminum oxide layer 205, a solution containing phosphoric acid, acetic acid, and nitric acid as the principal components with chromic acid added therein is used. The aluminum film 204 is etched by using a solution containing phosphoric acid, acetic acid, and nitric acid as the principal components.

The oxide layer 205 is etched using an etchant, i.e., a solution containing 72% by volume of phosphoric acid, from 9 to 10% by volume of nitric acid, 2% by volume of acetic acid, and balance water, with 3% by weight of chromic acid added therein. The function of nitric acid and acetic acid is to provide a smoothly etched interface. Chromic acid functions to form a barrier film on the surface of aluminum, thereby preventing etching from occurring on aluminum. Conclusively, by using a solution containing phosphoric acid, acetic acid, and nitric acid as the principal components with chromic acid added therein as an etchant, the oxide layer (aluminum oxide layer) 205 formed on the surface of aluminum can be etched selectively.

The etching step above is effected by maintaining the temperature during etching at 65° C. It is important to maintain the temperature during etching at a temperature as high as possible. More specifically, the etching process must be performed at a temperature of 60° C. or higher.

The film 204 containing aluminum as the principal component is etched after etching the oxide layer 205. The aluminum-based film 204 is etched by using a solution containing phosphoric acid, acetic acid, and nitric acid as the principal components as the etchant. More specifically in this case, this step of etching is effected by using a solution containing 72% by volume of phosphoric acid, from 9 to 10% by volume of nitric acid, 2% by volume of acetic acid, and balance water.

Figure 2D:
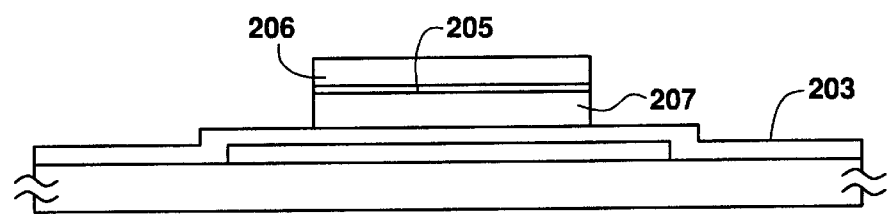
Figure 2E:
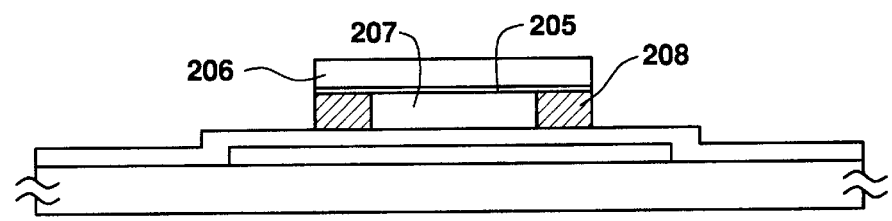
Figure 2F:
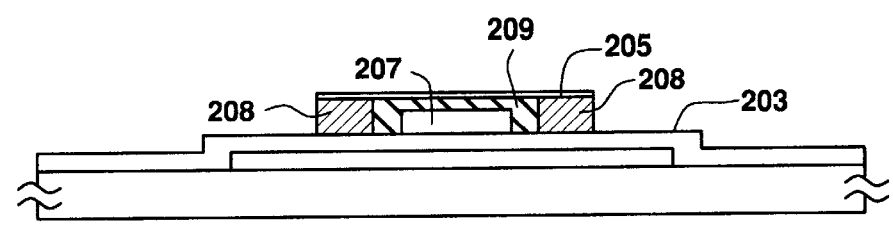

Referring to FIG. 2(D), a gate electrode 207 having a dense oxide layer 205 formed on the upper portion thereof is obtained. A porous oxide layer 208 is formed on the exposed sides of the gate electrode 207 by means of anodic oxidation. This step is effected in an electrolytic solution by using the gate electrode 207 as an anode (FIG. 2(E)).

The dense oxide layer and the porous oxide layer are formed differently by controlling the applied voltage during anodic oxidation.

The presence of a dense oxide layer 205 prior to the formation of porous oxide layer 208 is requisite. By providing the dense layer 205 previously, the oxidation can be allowed to proceed from the sides along the transverse direction. If no dense oxide layer 205 is provided previously, an electrolytic solution intrudes into the interface between the resist 206 and the gate electrode 207 to prevent uniform oxidation from occurring.

The oxide layer 208 can be formed at a desired thickness. In this case, specifically, the oxide layer 208 is grown to a thickness of 1 μm. The thickness of the oxide layer corresponds to the length of the lightly doped region in the later step of implanting impurities.

Then, a dense oxide layer 209 is formed by anodic oxidation after stripping off the resist 206. The oxide layer 209 is provided to a thickness of about 2,000 Å. The thickness of the oxide layer 209 corresponds to the length of the offset gate region.

Figure 3A:
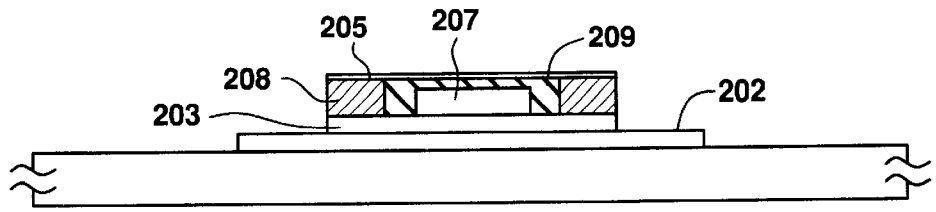
FIGS. 3(A) to 3(E) are a diagram showing schematically the process steps for fabricating a thin film transistor (TFT) according to an embodiment of the present invention.

The silicon oxide film 203 is removed thereafter by using as a mask, the gate electrode 207, the dense oxide layer 209 surrounding the gate electrode, and the porous oxide layer 208 further surrounding the dense oxide layer 209 (FIG. 3(A)).

Then, the porous oxide layer 208 is removed selectively. This step is effected by using, as an etchant, a solution containing 72% by volume of phosphoric acid, from 9 to 10% by volume of nitric acid, 2% by volume of acetic acid, and balance water, with 3% by weight of chromic acid added therein. The etching step is conducted by maintaining the temperature at 65° C.

The etchant above allows etching to proceed at a rate of 6,000 Å/min on a porous oxide layer, and at a rate of 450 Å/min on a dense oxide layer. Thus, the porous oxide layer alone can be etched selectively by using the etchant. The etchant hardly has an etching effect on other materials.

Figure 3B:
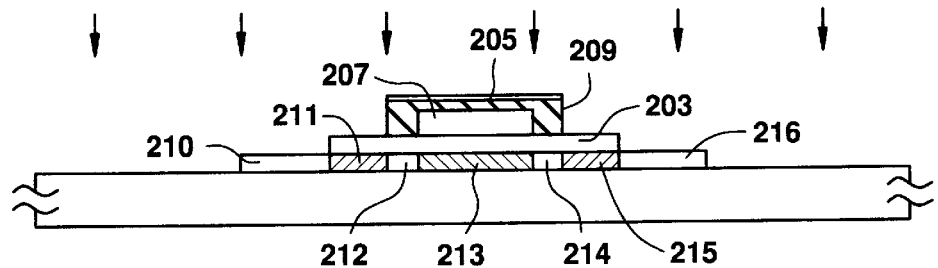
Figure 3C:
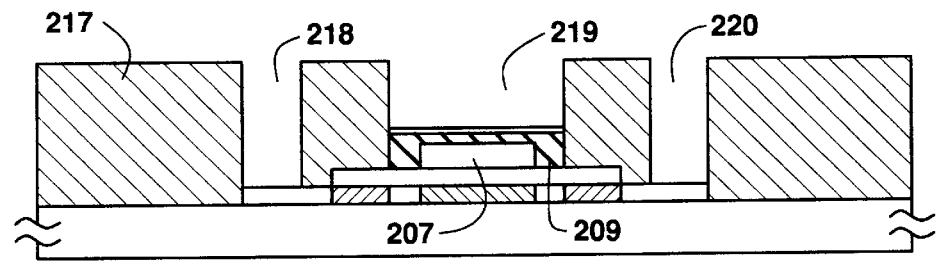
Figure 3D:
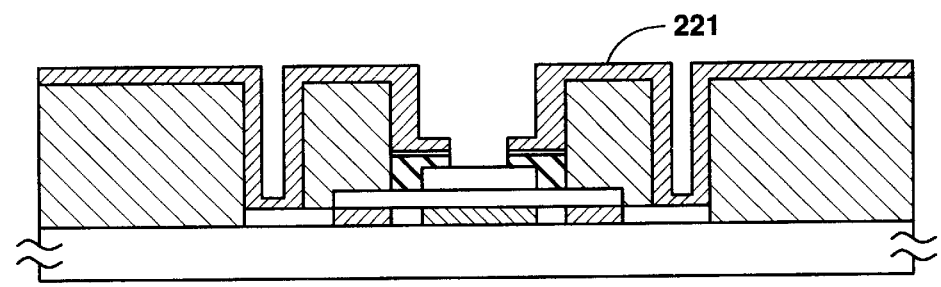

Thus is obtained a state as shown in FIG. 3(B). The necessary impurity ions are added by ion implantation or by plasma doping. More specifically, an N-channel type TFT is fabricated by implanting phosphorus (P) ions, or a P-channel type TFT is fabricated by implanting boron (B) ions. Offset gate regions 212 and 214 are formed corresponding to the thickness of the dense oxide layer 209. The regions 211 and 215 are formed as lightly doped regions using the residual silicon oxide film as a mask 203. Source/drain regions are formed by directly implanting ions to regions 210 and 216.

Then, upon completion of the addition of the impurity ions, a laser radiation or an intense light is irradiated to activate the thus added impurities and to anneal the portions that are damaged by ion implantation or by plasma doping.

An interlayer insulating layer 217 is formed by using a silicon oxide film, and contact holes 218 to 220 are formed thereafter. The contact holes are formed by using a buffered hydrofluoric acid which is an etchant for silicon oxide.

The exposed oxide layers 205 and 209 are etched thereafter by using a resist mask 221. The etching step is effected by using, as an etchant, a solution containing phosphoric acid, acetic acid, and nitric acid as the principal components, with chromic acid added therein. More specifically, the etching is effected at a temperature of 65° C. by using a solution containing 72% by volume of phosphoric acid, from 9 to 10% by volume of nitric acid, 2% by volume of acetic acid, and balance water, with 3% by weight of chromic acid added therein. Thus, by the function of chromic acid, a barrier film for preventing etching from occurring on the gate electrode 207 is formed on the surface of the gate electrode 207 containing aluminum as the principal component. This signifies that the oxide layer 209 alone can be etched selectively. Accordingly, a step free of unwanted etching of the gate electrode can be realized.

Figure 3E:
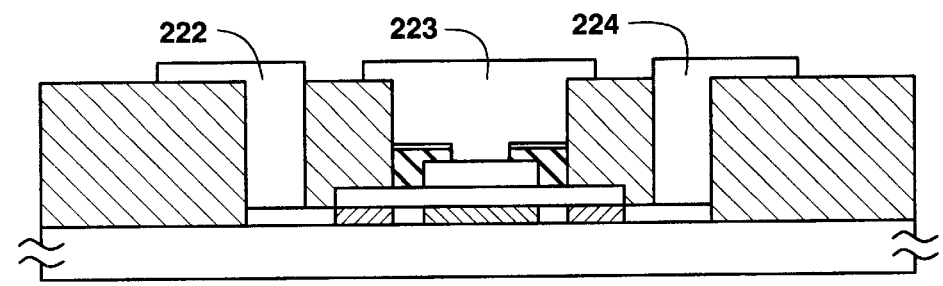

After removing the resist 221, source/drain electrode interconnection 222, drain/source electrode interconnection 224, and a gate electrode interconnection 223 are formed by using an appropriate metal, for instance, aluminum. The structure can be completed into a TFT by applying heat treatment at 350° C. under hydrogen atmosphere (FIG. 3(E)).

As described in the foregoing, the process according to the present invention utilizes a solution containing phosphoric acid, acetic acid, and nitric acid as the principal components, with chromic acid added therein to etch an oxide containing aluminum as the principal component. Accordingly, the oxide of aluminum alone can be selectively etched without etching aluminum.

Furthermore, a porous aluminum oxide can be selectively etched by using the etchant above.

While the invention has been described in detail and with reference to specific embodiments thereof, it will be apparent to one skilled in the art that various changes and modifications can be made therein without departing from the spirit and scope thereof.

What is claimed is:

1. A process of forming a transistor comprising the steps of:
   forming a gate electrode comprising aluminum on an insulating surface;
   forming an anodic oxide film comprising aluminum on a surface of said gate electrode;
   selectively removing a part of said anodic oxide film from said gate electrode by etching using a solution comprising phosphoric acid, acetic acid, nitric acid and a barrier forming material with said barrier forming material forming a barrier layer on said gate electrode at said part.

2. A process according to claim 1 wherein said solution contains at a ratio by volume, from 40 to 90 parts of phosphoric acid, from 10 to 100 parts of acetic acid, and from 1 to 40 parts of nitric acid, and wherein said solution contains from 1 to 10% by weight of chromic acid as said barrier forming material.

3. A process according to claim 1 wherein said barrier forming material comprises chromium oxide or iron oxide.

4. A process of forming a transistor comprising the steps of:
   forming a gate electrode comprising aluminum, a barrier anodic oxide comprising aluminum, and a mask anodic oxide comprising aluminum, said gate electrode being provided on an insulating surface, said barrier anodic oxide being provided on said gate electrode, and said mask anodic oxide being provided on said barrier anodic oxide;
   forming an interlayer insulating layer over said gate electrode, said barrier anodic oxide and said mask anodic oxide;
   forming an opening in said interlayer insulating layer above said gate electrode;

removing a part of said barrier anodic oxide and a part of said mask anodic oxide selectively through said opening from said gate electrode by etching using a solution comprising phosphoric acid, acetic acid, nitric acid and a barrier forming material with said barrier forming material forming a barrier layer on said gate electrode at said parts; and forming a gate electrode interconnection connected with said gate electrode through said opening and the removed part of said barrier anodic oxide and the removed part of said mask anodic oxide.

5. A process according to claim 4 wherein said barrier forming material comprises chromium oxide or iron oxide.

6. A process of forming a transistor comprising the steps of:

forming a gate electrode comprising aluminum on an insulating surface;

forming a barrier anodic oxide film comprising aluminum on a surface of said gate electrode;

forming a mask anodic oxide film comprising aluminum to provide said mask anodic oxide film on a surface of said barrier anodic oxide film;

selectively removing a part of said barrier anodic oxide film and a part of said mask anodic oxide film from said gate electrode by etching using a solution comprising phosphoric acid, acetic acid, nitric acid and a barrier forming material with said barrier forming material forming a barrier layer on said gate electrode at said parts.

7. A process according to claim 6 wherein said solution contains at a ratio by volume, from 40 to 90 parts of phosphoric acid, from 10 to 100 parts of acetic acid, and from 1 to 40 parts of nitric acid, and wherein said solution contains from 1 to 10% by weight of chromic acid as said barrier forming material.

8. A process according to claim 6 wherein said barrier forming material comprises chromium oxide or iron oxide.

* * * * *